United States Patent
Yamazaki et al.

(10) Patent No.: US 6,819,598 B2
(45) Date of Patent: Nov. 16, 2004

(54) MEMORY MODULE SELF IDENTIFICATION

(75) Inventors: Satoshi Yamazaki, Sagamihara (JP); Tetsu Kubota, Fujisawa (JP); Norio Fujita, Shiga-ken (JP)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/605,765

(22) Filed: Oct. 24, 2003

(65) Prior Publication Data
US 2004/0125658 A1 Jul. 1, 2004

(30) Foreign Application Priority Data
Oct. 25, 2002 (JP) ...................................... 2002-311403

(51) Int. Cl.[7] .............................................. G11C 7/00
(52) U.S. Cl. .............. 365/189.01; 365/226; 365/189.04
(58) Field of Search ........................... 365/189.01, 226, 365/189.04, 230.01, 230.03, 230.06, 233, 189.05, 200

(56) References Cited

U.S. PATENT DOCUMENTS

| | | | | |
|---|---|---|---|---|
| 5,727,182 A | | 3/1998 | Fukushima et al. | |
| 5,982,697 A | * | 11/1999 | Williams et al. | 365/230.03 |
| 6,070,222 A | * | 5/2000 | Farmwald et al. | 711/105 |
| 6,084,803 A | * | 7/2000 | Sredanovic et al. | 365/189.05 |
| 6,484,255 B1 | * | 11/2002 | Dulong | 712/224 |
| 6,535,450 B1 | * | 3/2003 | Ryan et al. | 365/230.03 |

FOREIGN PATENT DOCUMENTS

JP   8-305629   11/1996

* cited by examiner

Primary Examiner—Vu A. Le
Assistant Examiner—Dang Nguyen
(74) Attorney, Agent, or Firm—Todd M. C. Li

(57) ABSTRACT

A memory module is described having a memory array storing data, an ID information output circuit for outputting ID information for identifying memory modules, and output switching means for selectively switching between output from the memory array and output from the ID information output circuit, and output from the ID information output circuit will be selected instead of output from the memory array until the memory module is initially written after the power supply to the memory module has been started. This enables a memory module to be identified without having to add parts to a computer system unit or providing a ROM storing a specification or the like to the memory module.

16 Claims, 4 Drawing Sheets

MEMORY MODULE SELF IDENTIFICATION

BACKGROUND OF INVENTION

The invention relates to a memory module for use as main memory or VRAM (Video Random Access Memory), information processing apparatus, method for initialization relating a memory module, and a program.

In general, features of high-speed memories for use in personal computers such as DDR-SDRAM (Double Data Rate Static Dynamic Random Access Memory) slightly vary depending on their suppliers and types. Thus, when such high-speed memory is driven, the output strength of the access signal by a driver needs to be adjusted so as to adapt it to its supplier and type. The adjustment is performed by a configuration program (basic input/output system or BIOS) by providing optimal access parameters and the like to the memory controller. In such a case, the configuration program needs to know in advance what type of memory module is present.

As such, recent DIMM (Dual Inline Memory Module) type-memory module is provided with ROM (Read-Only Memory) on which its specification is recorded so that a configuration program can provide optimal parameters to the memory controller based on information recorded on the ROM. Such a ROM records many pieces of information including a supplier, memory capacity, and access speed, etc. The function for informing the BIOS of the specification of DIMM with ROM on DIMM in that way is known as a SPD (Serial Presence Detect) function.

Meanwhile, a technology is also known where only an identification (ID) number is given to the IMM and information relating to the configuration of the DIMM is recorded as a table on ROM provided in the system unit of a personal computer (see, for example, U.S. Pat. No. 5,727,182 and JP8305629A2). In this case, in setting various parameters relating to the DIMM, corresponding configuration parameters can be obtained from the table based on the ID number read from the DIMM.

On the other hand, for reasons of cost or supply, memory from several limited suppliers may be implemented as high-speed memory such as VRAM (Video RAM) deployed on a main board. Although it is necessary to identify the type of VRAM in initialization also in this case, providing ROM for identifying VRAM is not feasible in terms of cost since VRAM is not as generic as DIMM. As such, bits for identification are currently provided on the main board.

In this case, the procedure of initialization relating to VRAM is as follows; first, the type of VRAM is identified by reading the identification bits; then parameters corresponding to the type are obtained from the table and set to the memory controller; and arbitrary data is then written to a predetermined address, and check is made if the written data can be read to determine the capacity of the VRAM.

The above-mentioned SPD function, however, is disadvantageous in terms of cost and space because ROM has to be provided on the memory module.

The technology for providing an ID number on DIMM above requires addition of wires and hardware on the main board since the ID number should be read via a gate circuit, an ISA (Industry Standard Architecture) bus, and a processor bus.

Also, since the aforementioned technology for VRAM provides bits for identifying the VRAM on the main board, a main board with a different type of VRAM implemented thereon has also different implementation parts other than memory, thus needs to be handled as a different part in management. The technology is therefore disadvantageous in terms of management efficiency.

In view of such disadvantages in conventional art, an object of the invention is to allow a memory module to be easily identified without requiring wires or parts to be added in a computer system unit, i.e., a main board, or ROM to be provided on the memory module.

SUMMARY OF INVENTION

To attain the object, the memory module according to the invention comprises a memory array for storing data, an ID information output circuit for outputting ID information for identifying memory modules, and output switching means for selectively switching output from the memory array and output from the ID information output circuit to be output, wherein the output switching means selects output from the ID information output circuit instead of output from the memory array until the memory module is initially written after power supply to the memory module has been started.

The memory module may be VRAM and main memory, for example. Modules for expansion may be also possible. The ID information may include 4-bit information that identifies the supplier of the memory module or 8-bit information that identifies the supplier and type of the memory module. The ID information output circuit may be one that has output terminals corresponding to each bit and a circuit that grounds respective terminals or connects them to a predetermined voltage source so that voltages corresponding to on and off of the bits are applied to each output terminal. The output switching means may be a selector that switches between output from the ID information output circuit and output from the memory array to be output in accordance with on and off of a predetermined input control signal, for example.

With this configuration, when power supply to the memory module is started and initialization of the memory module begins, the output switching means selects output from the ID information output circuit before the memory module is initially written. Therefore, if reading is performed at any address before the initial writing is done, ID information for the memory module will be read out from the ID information output circuit. The read out ID information is used to obtain corresponding information for initialization from a table. Subsequently, after writing is done once, the output switching means will select output from the memory array, so data from the memory array will be read out at subsequent reading.

Thus, in initialization of the memory module, ID information can be obtained simply by performing readout before the memory module is initially written. If the memory module is of a conventional type, data within the memory array would be read out when reading is done before initial writing. In that case, the memory array has nothing written to it, thus an undefined value, e.g. hexadecimal FF would be read out. Thus, even when a conventional memory module and the memory module of the invention are implemented concurrently, it is possible to easily distinguish the memory module of the invention from the conventional one and perform initialization for the memory module of the invention based on obtained ID information, and in a conventional way for the conventional one. The application of the invention does not require addition of parts and circuits to the computer system unit or provision of ROM on the memory module. Slight modification to an initialization program and addition of a simple circuit onto the memory module will suffice.

The memory module may further comprise a switch control means for controlling the output switching means such that it selects output from the ID information output circuit from the initiation of power supply to initial writing, and subsequently selects output from the memory array, based on reset detection signal that is generated when the power supply is started and a signal corresponding to a signal indicating writing to the memory module.

In that case, the memory module may further comprise a reset detection means for outputting the reset detection signal in response to the initiation of power supply to the memory module.

In a more specific aspect of the invention, the memory module comprises a memory array, an ID information output circuit for outputting identification information for identifying memory modules, a flip-flop that is set and reset in accordance with a reset detection signal that is generated when power supply to the memory module is started and a signal corresponding to a signal indicating writing to the memory module, and a selector for selectively switching between output from the memory array and output from the ID information output circuit to be output depending on output from the flip-flop.

The initialization method relating to the memory module of the invention is an initialization method relating to a memory module in a computer, and is characterized in that it comprises a step of the computer performing reading before performing initial writing to the memory module after the computer has been turned on; and a step of, if information obtained by the reading is ID information for identifying the memory module, the computer performing initialization relating to the memory module based on the ID information.

With a conventional memory module, a value that is read from a memory array through reading after turning the computer on and before the memory module is initially written is undefined. In contrast, if the memory module is the one according to the invention, reading before initial writing would read ID information for identifying the memory module. In this case, the computer can carry out initialization of the memory module based on the ID information.

The initialization method relating to the memory module of the invention may further comprise a step of the computer determining whether the information obtained by the reading is predetermined ID information by examining if ID information corresponding with the information obtained by the reading exists in a predetermined table, wherein the initialization may be performed based on various information in the table corresponding to the ID information obtained by the reading. Entries of the table can include the specification of the memory module itself such as its memory size, the number of banks, and access timing, and an optimal output current value for each signal line that may vary depending on combinations of memory modules and computers, in addition to ID information.

The initialization method relating to the memory module of the invention may further comprise a step of, if the information obtained by the reading is not the ID information or is an undefined value, the computer obtaining the identification information from output means for identification information for the memory module that is provided in the computer system unit; and a step of the computer performing initialization relating to the memory module based on the identification information.

The method may further comprise a step of, if the information obtained by the reading is not the ID information or is an undefined value, performing initialization of the memory module utilizing SPD function.

The information processing apparatus according to the invention consists of means for performing each step of the initialization method relating to the memory module of the invention. The means is configured using a computer and a program (BIOS). And the program according to the invention is characterized in that it causes the computer to execute each step of the initialization method relating to the memory module of the invention.

DETAILED DESCRIPTION

Figure 1:
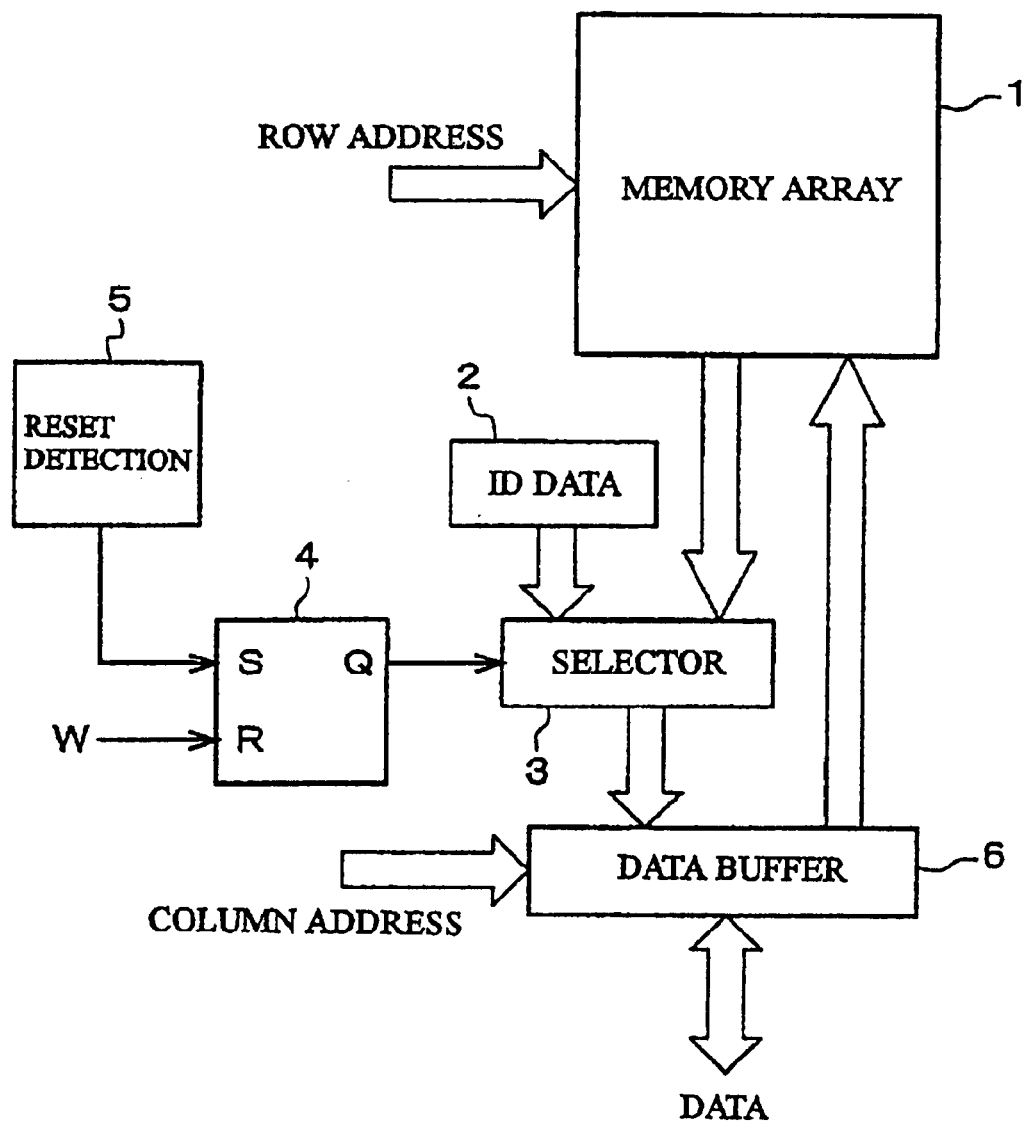
FIG. 1 is a block diagram showing the configuration of a memory module according to an embodiment of the invention.

FIG. 1 is a block diagram showing the configuration of a memory module according to an embodiment of the invention. As shown, the memory module comprises a memory array 1 for storing data, an ID data output circuit 2 for outputting ID data for identifying the memory module, a selector 3 for selectively switching between output from the memory array 1 and output from the ID data circuit 2 to be output, and a flip-flop 4 for, after the computer in which the memory module is mounted is turned on and until the memory module is initially written, controlling the selector 3 such that output from the ID data output circuit 2 is selected instead of that from the memory array 1.

Reference number 5 in the figure designates a reset detection means for outputting reset detection signal in response to the computer in which the memory module is mounted being turned on. The reset detection means 5 can detect that the power supply to the memory module has been started with the computer being turned on, and can output reset detection signal. The output of the reset detection means 5 is connected to the input S of the flip-flop 4. And to the input R of the flip-flop 4, signal W based on WE (Write Enable) that is a signal allowing writing to the memory module is input. Therefore, the flip-flop 4 controls the selector 3 to select the output from the ID data output circuit 2 after the reset detection means 5 has output reset detection signal and until the memory module is first written, and subsequently to select the output from the memory array 1.

Receiving/sending data with the memory array 1 or selector 3 is through a data buffer 6. When receiving/sending data, the data buffer 6 performs adjustment of signal level and the like. The ID data output circuit 2, selector 3, flip-flop 4, and reset detection means 5 are formed on the memory module as IC (integrated circuits). The ID data output circuit 2 may be formed as a simple circuit that connects each terminal to a ground or a voltage source so that a fixed value of each bit comprising ID data is output by an each corresponding terminal. For the ID data, 4-bit data that identifies the supplier of the memory module, or 8-bit data that identifies the supplier and type of the memory module may be adopted.

Figure 2:
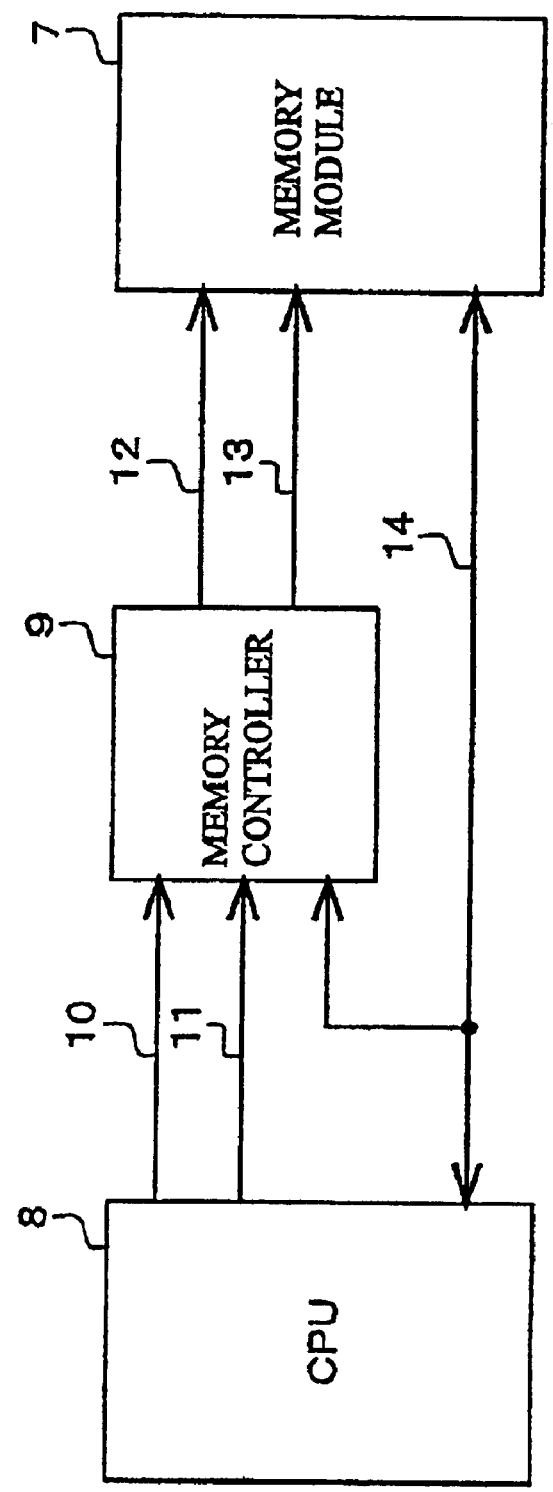
FIG. 2 is a block diagram showing the relation between the memory module in FIG. 1 and CPU of the computer in which it is implemented.

FIG. 2 is a block diagram showing the relation between the memory module in FIG. 1 and the CPU (Central Processing Unit) of the computer in which the memory module is implemented. A memory controller 9 intervenes between the memory module 7 and the CPU 8 for allowing access from the CPU 8 to the memory module 7. The CPU 8 and the memory controller 9 are connected by an address bus 10 and a control bus 11. The memory controller 9 and the memory module 7 are connected by a memory address bus 12 and a signal line 13 that includes respective signal lines for RAS (row address strobe) signal, CAS (column address strobe) signal, and WE (Write Enable) signal. The memory controller 9 provides the memory module 7 with an appropriate row address, column address, RAS signal, CAS signal, or WE signal in response to an access request from the CPU 8, allowing receiving/sending data between the CPU 8 and the memory module 7 through the data bus 14.

With this configuration, when the computer in which the memory module is implemented is turned on and power supply to the memory module is started, the reset detection means 5 outputs reset detection signal in response. This turns on input S of the flip-flop 4 and output Q, which puts the selector 3 into a state in which output of the ID data output circuit 2 is selected. Meanwhile, the computer starts a series of boot sequences with BIOS in response to the depression of the power button.

Figure 3:
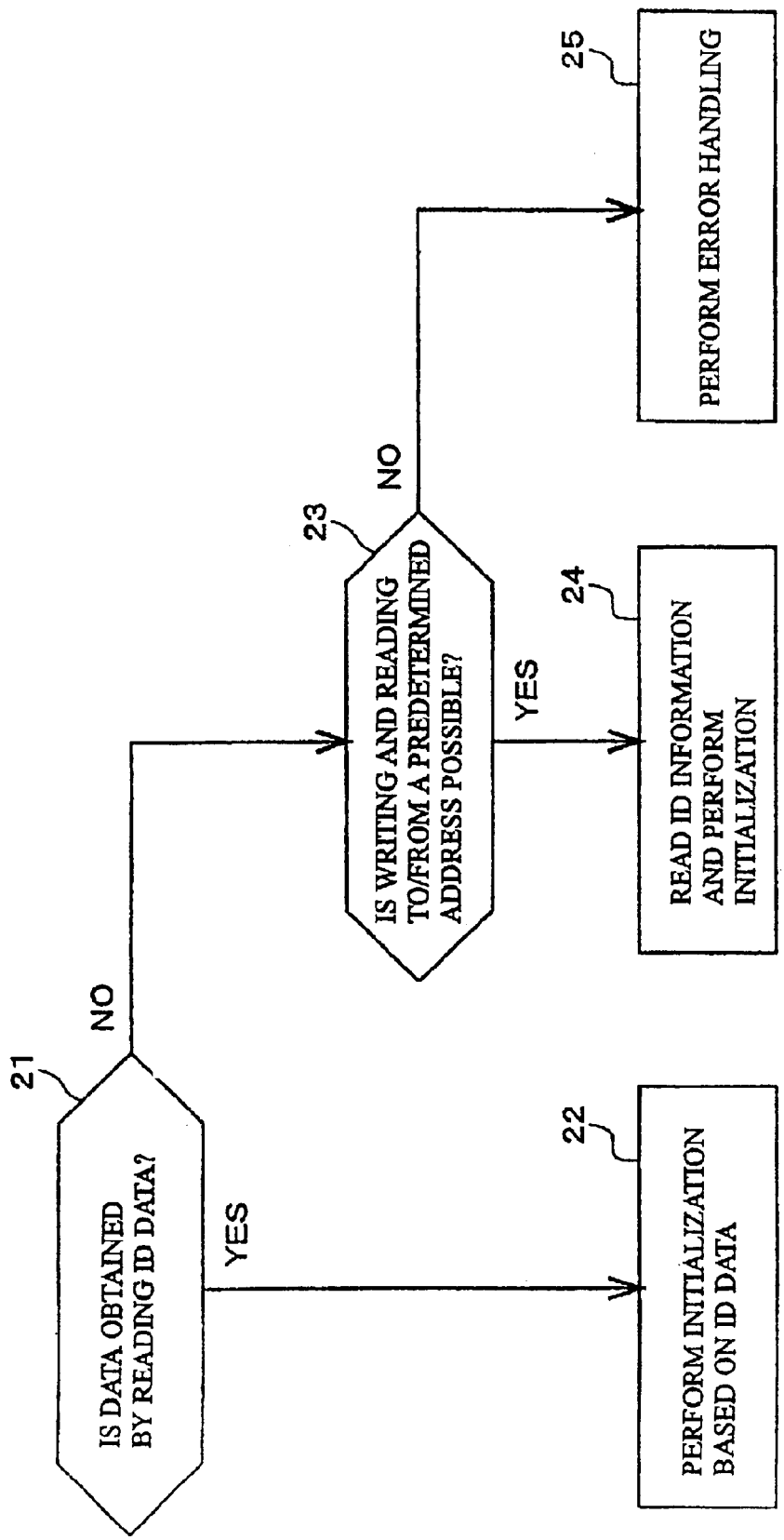
FIG. 3 is a flowchart illustrating a portion of processing by BIOS adapted for the memory module in FIG. 1.

FIG. 3 is a flowchart illustrating initialization processing for the memory module in FIG. 1 in the boot sequence. This example is for a case where the memory module is VRAM. Processing at steps 23 through 25 in FIG. 3 is processing conventionally performed, and steps 21 and 22 are processing added according to the invention. In addition, ROM storing BIOS also records a table for initialization having ID data for identification and parameters required for initialization for a variety of available memory modules.

Once initialization is started, reading is performed at a starting address of the memory module at step 21, and it is determined if the content that has been read out is ID data for identifying the memory module or is in an undefined state. When reading is performed, the access speed is reduced as appropriate.

Since the memory module has not yet been written at this point, if the memory module from which reading was performed is of the type according the invention shown in FIG. 1, the flip-flop 4 still remains in a set state which was caused by the application of reset detection signal to it when the computer was turned on. The selector 3 thus selects the ID data output circuit 1 as its input based on the on-state of output Q of the flip-flop 4. As a result, reading is made from the ID data output circuit 1 and ID data can be obtained.

On the other hand, if the memory module is of a conventional type, content at the starting address is read from the memory array, but the read out value is undefined since the memory module has not been written yet at this point. In other words, if content that has been read out is ID data, it means the memory module is of the type according to the invention in FIG. 1, and if the content is undefined, it means the memory module is of a conventional type.

The determination at step 21 can be done by, for example, checking whether the read out content corresponds with any ID data in the initialization table or not. If it corresponds with any ID data, it can be determined that the read data is ID data, and if it corresponds with no ID data, that the read data is not ID data and is in an undefined state. If the read data is ID data, the procedure proceeds to step 22, and otherwise to step 23.

At step 22, initialization of the memory module is performed by obtaining configuration parameters such as corresponding access timing and the like from the initialization table and setting them to the memory controller, based on the ID data that has been read at step 21.

At step 23, writing and reading is done to a predetermined address that corresponds to the memory module and it is checked if the same data as the data written can be read. If the same data could be read, at least the memory module exists at the address. In contrast, if the read value is an undefined value and thus the same data cannot be read, the memory module does not exist at the address. If the same data could be read, the procedure proceeds to step 24; otherwise, proceeds to step 25.

At step 24, initialization of the memory module is performed by reading identification information provided on the main board for the memory module of a conventional type, obtaining various configuration parameters corresponding to the identification information from the table provided beforehand and setting them to the memory controller.

At step 25, since it has been determined that the memory module does not exist, error handling is performed.

After the initialization at step 22 or 24 has been finished, processing at the next stage in the boot sequence will be performed.

With the memory module according to the invention in FIG. 1, since ID data from the ID data output circuit 2 is output rather than data from the memory array 1 for reading operations until the memory module is initially written, information for identifying the memory module can be easily obtained by just adding the processing at step 21 in FIG. 3, for example, to the BIOS.

According to the processing in FIG. 3, initialization can be executed without trouble whether VRAM of the inventive type in FIG. 1 or VRAM of a conventional type is employed as the memory module. Therefore, whereas in a conventional case identification information for VRAM was provided on the main board and the main board and the VRAM were managed as one part, using VRAM of the type shown in FIG. 1, VRAM can be managed as another part. This leads to increased efficiency in parts management.

Figure 4:
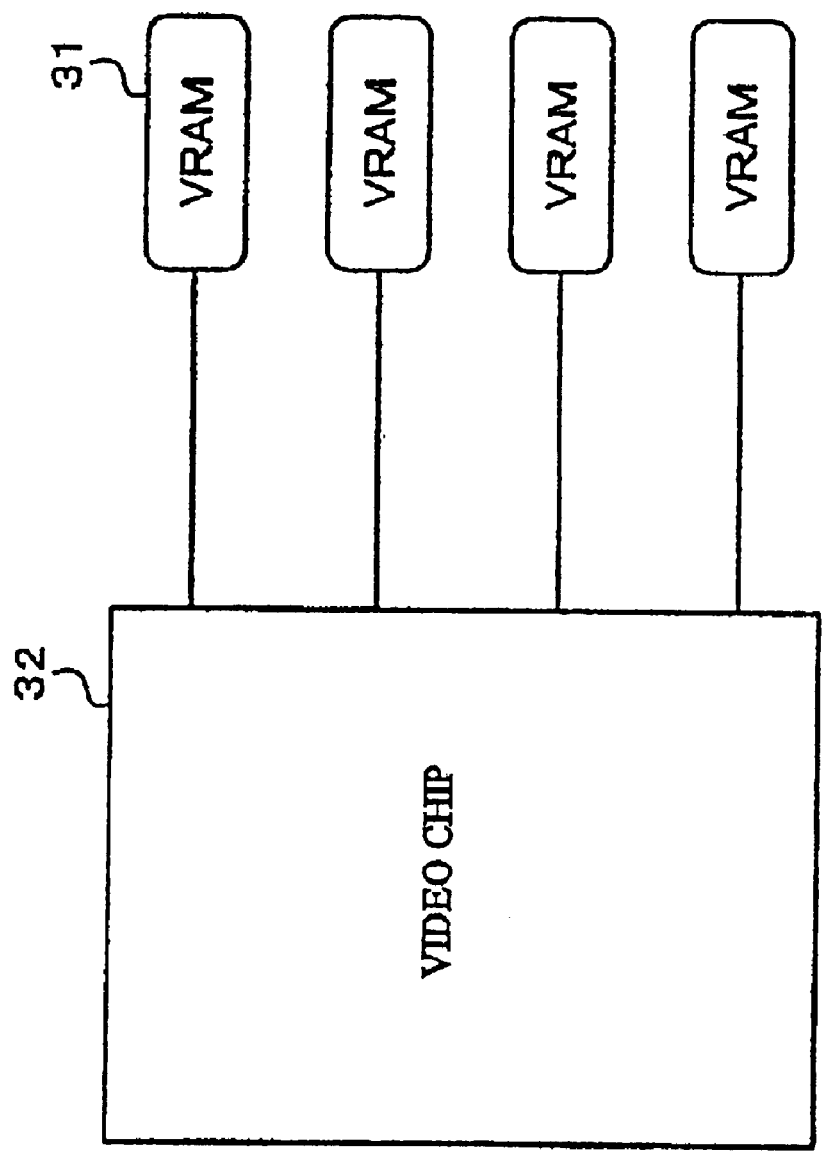
FIG. 4 shows a plurality of VRAMs being connected to a video chip.

When a case is considered where a plurality of memory modules are implemented as in the case in FIG. 4 where four VRAMs 31 are connected to the video chip 32, the processing in FIG. 3 may be repeated for each memory module. In other words, after step 22 or 24, the procedure returns to step 21. In such a case, the addresses for reading at step 21 and for writing and reading at step 23 need to be increased successively for one memory module so that they correspond to individual memory modules.

If the same content as written content could not be read out at step 23, it means either no memory module exists or one or more memory modules exist but no more remain to be processed. Accordingly, it is determined at step 25 if one or more memory modules were found, and if no memory module exists, error handling is performed, and if one or more memory modules exist, the processing proceeds to the next stage in the boot sequence.

As individual memory modules, one according to the invention in FIG. 1 and conventional one can be implemented concurrently in this case. In each repeated processing in FIG. 3, processing at steps 21 and 22 will be performed for the memory module of the invention, and processing at steps 21, 23, and 24 will be performed for a conventional memory module.

The invention is not limited to the above-mentioned embodiment, but may be implemented with modification as appropriate. For example, although the processing in FIG. 3 in the embodiment above is intended for VRAM, it can be also applied to main memory. In such a situation, processing at steps 21 and 22 in FIG. 3 may remain the same, and processing at steps 23 through 25 may be changed to processing for SPD (Serial Presence Detect)-capable main memory.

In that case, processing at step 21 could distinguish main memory according to the invention from main memory that only supports SPD function, and processing for initialization corresponding to each type could be done. Thus, a situation can be addressed as well where multiple pieces of main memory according to the invention and main memory that only supports SPD function are mixed. The application of the invention can also eliminate the requirement for SPD function and necessity of mounting ROM with the specification of a memory module recorded onto the memory module.

As described above, according to the memory module of the invention, since output from the ID information output circuit is selected instead of output from a memory array after power supply to the memory module has been started and until the memory module is initially written, BIOS can obtain ID information for identifying the memory module and perform initialization relating the memory module, by providing a simple circuit on the memory module and slightly modifying the BIOS, without having to modify the hardware configuration in the computer system unit or provide a ROM recording the specification in the memory module.

Also, according to the initialization method for a memory module of the invention, an information processing apparatus, and a program, if a value that is obtained through reading after power supply to the memory module has been started and before it is initially written is predetermined ID information, initialization relating to the memory module will be performed based on the ID information, thus allowing ID information to be obtained from the memory module of the invention and its initialization to be performed.

It will be appreciated by those skilled in the art that the method and application to various layouts in accordance with the present invention is not limited to the embodiments discussed above. Accordingly, the invention is intended to encompass all such alternatives, modifications and variations which fall within the scope and spirit of the invention and the following claims.

We claim:

1. A memory module, comprising:
    a memory array;
    an ID information output circuit for outputting ID information for identifying memory modules; and
    output switching means for selectively switching between output from said memory array and output from said ID information output circuit to be output,
    wherein said output switching means selects output from said ID information output circuit instead of output from said memory array until the memory module is initially written after power supply to the memory module has been started.

2. The memory module according to claim 1, further comprising a switch control means for controlling said output switching means such that it selects output from said ID information output circuit from said start of power supply to initial writing, and subsequently selects output from said memory array, based on a reset detection signal that is generated when the power supply is started and a second signal corresponding to a signal indicating writing to the memory module.

3. The memory module according to claim 2, further comprising reset detection means for outputting said reset detection signal in response to said start of power supply.

4. A memory module, comprising:
    a memory array;
    an ID information output circuit for outputting identification information for identifying memory modules;
    a flip-flop that is set and reset in accordance with a reset detection signal that is generated when power supply to the memory module is started and a second signal corresponding to a signal indicating writing to the memory module; and
    a selector for selectively switching between output from said memory array and output from said ID information output circuit to be output depending on output from said flip-flop.

5. An information processing apparatus, comprising:
    a memory module;
    means for performing reading from said memory module before it is initially written after said memory module has been turned on; and
    means for, if the information obtained by said reading is ID information for identifying said memory module, performing initialization relating to said memory module based on the ID information.

6. The information processing apparatus according to claim 5, further comprising:
    means for determining if the information obtained by said reading is said ID information by examining if ID information corresponding with the information obtained by said reading exists in a predetermined table,
    wherein said initialization is performed based on configuration information corresponding to the ID information in said table.

7. The information processing apparatus according to claim 5, further comprising:
    means for, if the information obtained by said reading is not said ID information or is an undefined value, obtaining the identification information of said memory module from output means for identification information for said memory module that is provided in a system unit of the information processing apparatus; and
    means for performing initialization relating to said memory module based on said identification information.

8. The information processing apparatus according to claim 5, further comprising:
    means for, if the information obtained by said reading is not said ID information or is an undefined value, performing initialization of said memory module utilizing an SPD function.

9. An initialization method relating to a memory module in a computer, comprising:
    a step of said computer performing reading from said memory module before said memory module is initially written after said computer has been turned on; and
    a step of, if the information obtained by said reading is ID information for identifying said memory module, said computer performing initialization relating to said memory module based on the ID information.

10. The initialization method relating to a memory module according to claim 9, further comprising:

a step of said computer determining whether the information obtained by said reading is said ID information by examining if ID information corresponding with the information obtained by said reading exists in a predetermined table, wherein said initialization is performed based on configuration information corresponding to the ID information in said table.

11. The initialization method relating to a memory module according to claim 9, further comprising:

a step of, if the information obtained by said reading is not said ID information or is an undefined value, said computer obtaining the identification information of said memory module from output means for identification information for said memory module that is provided in a system unit of said computer; and a step of said computer performing initialization relating to said memory module based on said identification information.

12. The initialization method relating to a memory module according to claim 9, further comprising:

a step of, if the information obtained by said reading is not said ID information or is an undefined value, performing initialization of said memory module utilizing an SPD function.

13. A program for causing a computer to execute an initialization procedure of performing initialization relating to its memory module, said initialization procedure comprising the steps of:

reading from said memory module before initially writing to said memory module after power supply to said memory module has been started; and if information obtained by said reading is ID information for identifying said memory module, performing initialization relating to said memory module based on the ID information.

14. The program according to claim 13, wherein said initialization procedure further comprises the step of determining if the value obtained by said reading is said ID information by examining if ID information corresponding with the information obtained by said reading exists in a predetermined table, wherein said initialization is performed based on configuration information corresponding to the ID information in said table.

15. The program according to claim 13, wherein said initialization procedure further comprises:

a step of, if the information obtained by said reading is not said ID information or is an undefined value, obtaining the identification information of said module from output means for identification information for said memory module that is provided in a system unit of said computer;

and a step of performing initialization relating to said memory module based on said identification information.

16. The program according to claim 13, wherein said initialization procedure further comprises a step of, if the information obtained by said reading is not said ID information or is an undefined value, performing initialization of said memory module utilizing an SPD function.

* * * * *